United States Patent
Brooks et al.

(10) Patent No.: US 10,032,592 B2
(45) Date of Patent: Jul. 24, 2018

(54) FORCE SENSING SWITCH

(71) Applicant: Apple Inc., Cupertino, CA (US)

(72) Inventors: Ryan P. Brooks, Cupertino, CA (US);
John M. Brock, Menlo Park, CA (US);
Storrs T. Hoen, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 29 days.

(21) Appl. No.: 14/913,933

(22) PCT Filed: Aug. 22, 2014

(86) PCT No.: PCT/US2014/052415
§ 371 (c)(1),
(2) Date: Feb. 23, 2016

(87) PCT Pub. No.: WO2015/047616
PCT Pub. Date: Apr. 2, 2015

(65) Prior Publication Data
US 2016/0358737 A1 Dec. 8, 2016

Related U.S. Application Data

(63) Continuation of application No. 13/974,703, filed on Aug. 23, 2013, now abandoned.

(51) Int. Cl.
*G01L 1/04* (2006.01)
*H01H 89/00* (2006.01)
(Continued)

(52) U.S. Cl.
CPC ............ *H01H 89/00* (2013.01); *H01H 13/14* (2013.01); *H01H 13/52* (2013.01); *H01H 13/64* (2013.01);
(Continued)

(58) Field of Classification Search
CPC ....... G01L 1/04; G01L 1/2243; G01L 1/2218; H60R 2021/01516; H01H 89/00;
(Continued)

(56) References Cited

U.S. PATENT DOCUMENTS 7,554,167 B2 * 6/2009 Vaganov ............... G06F 3/0338
257/415
8,316,725 B2 * 11/2012 Wade ....................... G01L 1/18
73/760
(Continued)

FOREIGN PATENT DOCUMENTS

| CN | 1502090 | 6/2004 |
|----|---------|--------|
| CN | 1582452 | 2/2005 |

(Continued)

OTHER PUBLICATIONS

International Search Report and Written Opinion, PCT/US2014/052413, 12 pages, dated Jan. 12, 2015.

*Primary Examiner* — Manish S Shah
*Assistant Examiner* — Nigel Plumb
(74) *Attorney, Agent, or Firm* — Dorsey & Whitney LLP

(57) ABSTRACT

A force sensing switch for use in an electronic device can include one or more dome switches disposed over a top surface of a deflectable beam. One or more strain gauges can be disposed over at least one surface of the deflectable beam. An electronic device that includes at least one force sensing switch can further include a processing device operatively connected to the one or more strain gauges. Alternatively or additionally, an electrode can be disposed under a bottom surface of the deflectable beam and a capacitance measured between the bottom surface and the electrode.

19 Claims, 11 Drawing Sheets

(51) Int. Cl.
*H01H 13/52* (2006.01)
*H01H 13/64* (2006.01)
*H01H 13/14* (2006.01)
*H03K 17/96* (2006.01)

(52) U.S. Cl.
CPC ... H03K 17/9625 (2013.01); H01H 2239/052 (2013.01)

(58) Field of Classification Search
CPC ........ H01H 13/14; H01H 13/52; H01H 13/64; H01H 2239/052; H03K 17/9625
USPC ...... 73/862.637, 862.636, 862.632, 862.621, 73/862.629, 862.381, 862
See application file for complete search history.

(56) References Cited

U.S. PATENT DOCUMENTS

| | | | |
|---|---|---|---|
| 8,450,627 | B2 | 5/2013 | Mittleman et al. |
| 8,581,870 | B2 | 11/2013 | Bokma et al. |
| 8,700,829 | B2 | 4/2014 | Casparian et al. |
| 9,182,837 | B2 | 11/2015 | Day |
| 2006/0060459 | A1 | 3/2006 | Kaneo |
| 2011/0241442 | A1* | 10/2011 | Mittleman ........... H03K 17/962 307/112 |
| 2013/0067126 | A1* | 3/2013 | Casparian ............. G06F 3/0219 710/73 |
| 2013/0141342 | A1* | 6/2013 | Bokma ................ G06F 3/03547 345/173 |
| 2013/0247690 | A1* | 9/2013 | Wade .................... G01L 9/0052 73/862.632 |
| 2013/0292237 | A1* | 11/2013 | Arai ...................... G06F 3/0202 200/5 A |
| 2016/0203710 | A1 | 7/2016 | Bataillou et al. |
| 2016/0358737 | A1 | 12/2016 | Brooks et al. |

FOREIGN PATENT DOCUMENTS

| | | | |
|---|---|---|---|
| CN | 10141518 | 4/2009 | |
| DE | 10241220 | * 10/2003 | ............ H01H 3/807 |
| EP | 1691257 | * 8/2006 | ............ H03K 17/94 |
| FR | 2940707 | 7/2010 | |
| JP | 2006120550 | 4/2006 | |
| KR | 200297277 | 11/2002 | |
| KR | 1020040013742 | 2/2004 | |
| KR | 1020110030427 | 3/2011 | |
| KR | 101044036 | 6/2011 | |
| KR | 1020130091208 | 8/2013 | |
| WO | WO93/09553 | 5/1993 | |
| WO | WO01/45123 | 6/2001 | |

* cited by examiner

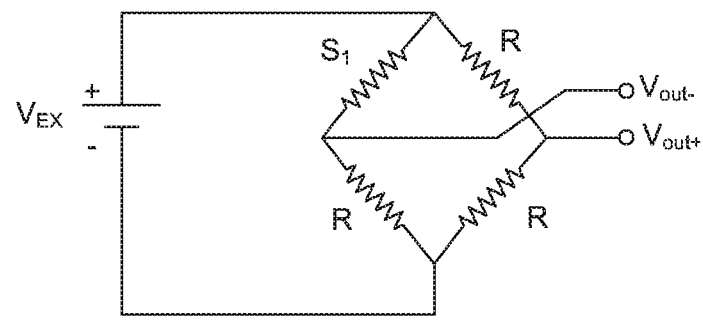
FIG. 8
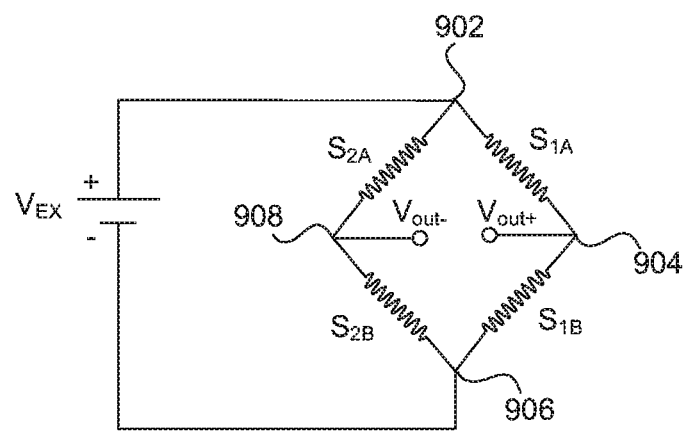
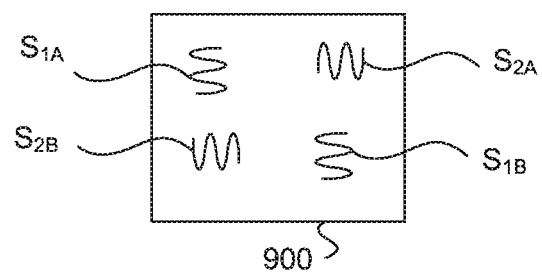
FIG. 9

FORCE SENSING SWITCH

CROSS REFERENCE TO RELATED APPLICATION

This application is a 35 U.S.C. § 371 application of PCT patent application No. PCT/US2014/052415, filed Aug. 22, 2014 and titled "Force Sensing Switch," which claims priority to U.S. non-provisional application Ser. No. 13/974,703, filed Aug. 23, 2013, and titled "Force Sensing Switch," the contents of which are incorporated herein by reference in their entireties.

TECHNICAL FIELD

The present invention relates to input devices in electronic devices, and more particularly to a force sensing switch in electronic devices.

BACKGROUND

Users can provide inputs to electronic devices using many different approaches. For example, an electronic device can include different input devices by which a user can interact with the electronic device. The input devices can include one or more switches, buttons, keys, actuators, or sensors (e.g., touch sensors), the actuation of which the electronic device can detect. Many of these input devices provide a binary input for user interaction in that the devices either register an input or they do not. For example, keyboards register an input only when a sufficient force is applied to a key to collapse a dome switch beneath a key. A dome switch is typically constructed by placing a deformable dome over a conductive contact pad on a circuit board. When a user presses down on the key, the dome collapses such that a conductive surface of the dome contacts the conductive contact pad, thereby actuating the dome switch. If an insufficient force is applied to the key, the dome does not collapse adequately and no input is registered. Likewise, both the force necessary to barely collapse the dome and the force far above that necessary to collapse the dome register as the exact same input.

Some applications and electronic devices may benefit from additional inputs beyond that provided strictly by binary input devices. For example, it may be advantageous for a user to be able to indicate an amount of force applied to an input device. For instance, a user could manipulate a screen element or other object in a first way with a relatively light touch or in a second way with a relatively more forceful touch.

SUMMARY

In one aspect, a force sensing switch can provide more than two inputs based on an amount of force applied to an input surface of an electronic device. The force sensing switch can be disposed under the input surface and include at least one dome switch disposed over a top surface of a deflectable beam. One or more strain gauges can also be disposed over one or more surfaces of the beam. For example, a strain gauge can be placed over the top surface and the bottom surface of the beam, or four strain gauges can be disposed over the top surface of the deflectable beam. When a force is applied to the input surface, the strain gauge or gauges can measure an amount of strain in the deflectable beam. A processing device can determine the amount of force applied to the input surface based on the amount of strain measured by at least one strain gauge. The processing device can be included in the electronic device, or the processing device can be operatively connected to the electronic device.

In another aspect, a method of operating a force sensing switch can include receiving a strain measurement from at least one strain gauge that represents an amount of strain of the deflectable beam when a deformable structure of the dome switch deforms based on a force applied to an input surface. The amount of force applied to the input surface can then be determined based on at least one strain measurement. Deforming the deformable structure may or may not actuate the dome switch. In some embodiments, actuation of the dome switch may or may not be recognized in that no action is taken based on the actuation of the dome switch.

In another aspect, a method of determining an operating mode of a force sensing switch can include determining whether the force sensing switch is to operate as a dome switch, as a force sensing switch, or as both a dome switch and a force sensing switch. If the force sensing switch is to operate as a dome switch, a determination can be made as to whether the dome switch is actuated based on the force applied to the input surface. An "on" state or signal can be transmitted to a processing device and/or an application when the dome switch is actuated. If the force sensing switch is to operate as a force sensing switch, an amount of force applied to an input surface can be determined based on a strain measurement received from at least one strain gauge. The determined amount of force can then be transmitted to a processing device and/or an application. If the force sensing switch is to operate as both a dome switch and a force sensing switch, all of the described actions can be performed. An "on" state or signal can be transmitted to a processing device and/or an application when the dome switch is actuated and the determined amount of force can be transmitted to the processing device and/or application.

In another aspect, an electronic device can include a dome switch disposed over a top surface of a deflectable beam and an electrode disposed under a bottom surface of the deflectable beam. The bottom surface of the deflectable beam and the electrode form a capacitive sensing element. The electronic device can include a sense line connected between the electrode and a sense circuit. The electronic device can include a processing device connected to the sense circuit.

In yet another aspect, a force sensing switch can include a dome switch disposed over a top surface of a deflectable beam and an electrode disposed under a bottom surface of the deflectable beam. The force sensing switch can be disposed below an input surface in an electronic device. A method for operating the force sensing switch can include measuring a capacitance between the bottom surface of the deflectable beam and the electrode when a deformable structure of the dome switch deforms based on a force applied to the input surface, and determining an amount of force applied to the input surface based on the measured capacitance. Deforming the deformable structure may or may not actuate the dome switch.

BRIEF DESCRIPTION OF THE DRAWINGS

Embodiments are better understood with reference to the following drawings. The elements of the drawings are not necessarily to scale relative to each other. Identical reference numerals have been used, where possible, to designate identical features that are common to the figures.

FIGS. 8-10 are circuit diagrams of different types of strain gauge configurations that can be used in a force sensing switch;

DETAILED DESCRIPTION

Embodiments described herein can provide a force sensing switch that can operate in multiple modes. The switch can operate as a dome switch, a force sensing switch, and/or both a dome switch and a force sensing switch. The dome switch provides a binary output (i.e., two states—on or off) while the force sensing switch provides more than two outputs. The operating mode can be determined by a software application or program running on, or interacting with an electronic device that includes one or more force sensing switches. Examples of an electronic device include, but are not limited to, a computing device, a laptop or tablet computing device, a smart telephone, an input device such as a mouse, key, or button, and a switch device.

A force sensing switch can include one or more dome switches disposed over a top surface of a deflectable beam and one or more strain gauges disposed over a surface of the deflectable beam. The one or more strain gauges can be placed over a top surface, a bottom surface, or both the top and bottom surfaces of the deflectable beam. When a downward force is applied to an input surface, the downward force is also applied to the dome switch and to the deflectable beam. The force can cause a deformable structure in the dome switch to compress, where the compression of the deformable structure may or may not actuate the dome switch. The deflectable beam can also deflect based on the applied force. The amount of beam strain can vary depending on the amount of force applied to the input surface. The strain gauge(s) can measure the amount of beam strain, and a processing device operatively connected to the one or more strain gauges can determine the amount of force applied to the input surface based on at least one strain measurement received from at least one strain gauge.

Figure 1:
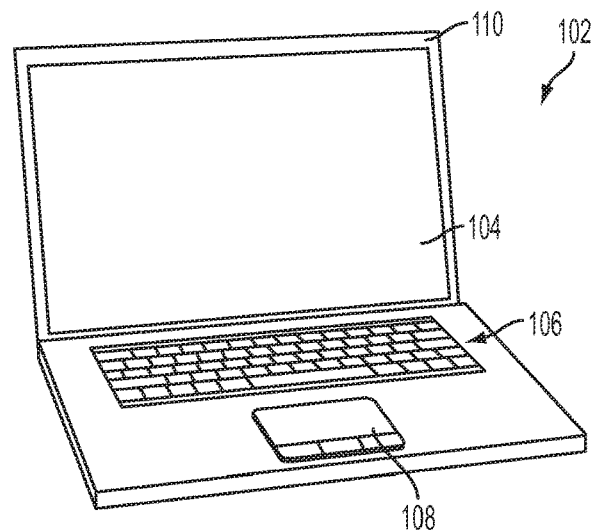
FIG. 1 is a front isometric view of an electronic device that can include one or more force sensing switches.

Referring now to FIG. 1, there is shown a front perspective view of an electronic device that can include one or more force sensing switches. As shown in FIG. 1, the electronic device 102 can be a laptop or netbook computer that includes a display 104, a keyboard 106, and a touch device 108, shown in the illustrated embodiment as a trackpad. An enclosure 110 can form an outer surface or partial outer surface and protective case for the internal components of the electronic device 102, and may at least partially surround the display 104, the keyboard 106, and the trackpad 108. The enclosure 110 can be formed of one or more components operably connected together, such as a front piece and a back piece.

The display 104 is configured to display a visual output for the electronic device 102. The display 104 can be implemented with any suitable display, including, but not limited to, a liquid crystal display (LCD), an organic light-emitting display (OLED), or organic electro-luminescence (OEL) display.

The keyboard 106 includes multiple keys that can be used to enter data into an application or program, or to interact with one or more viewable objects on the display 104. The keyboard 106 can include alphanumeric or character keys, navigation keys, function keys, and command keys. For example, the keyboard can be configured as a QWERTY keyboard with additional keys such as a numerical keypad, function keys, directional arrow keys, and other command keys such as control, escape, insert, page up, page down, and delete.

The trackpad 108 can be used to interact with one or more viewable objects on the display 104. For example, the trackpad 108 can be used to move a cursor or to select a file or program (represented by an icon) shown on the display. The trackpad 108 can use any type of sensing technology to detect an object, such as a finger or a conductive stylus, near or on the surface of the trackpad 108. For example, the trackpad 108 can include a capacitive sensing system that detects touch through capacitive changes at capacitive sensors.

One or more keys in the keyboard 106 can include a force sensing switch. Additionally or alternatively, the trackpad 108 can include one or more force sensing switches. The force sensing switch is described in more detail in conjunction with FIGS. 6 and 7.

Figure 2:
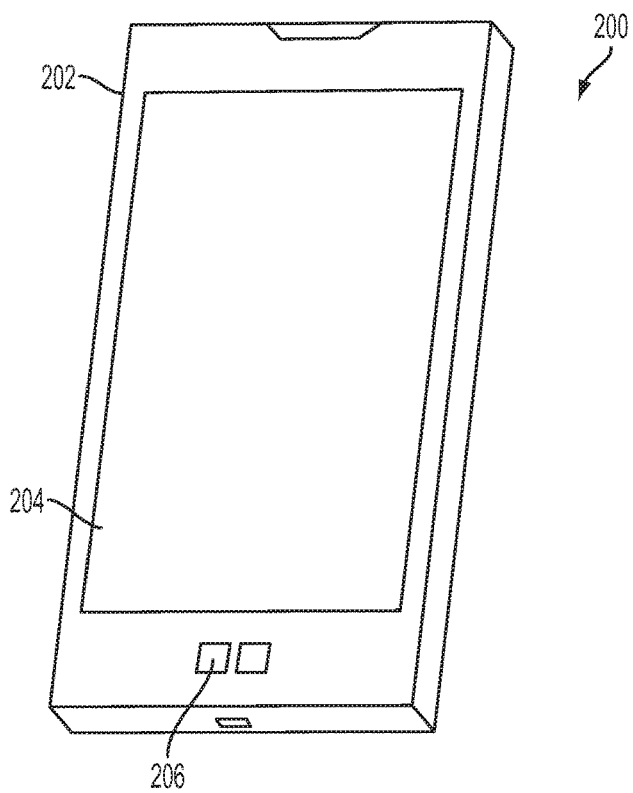
FIG. 2 is a front perspective view of another electronic device that can include one or more force sensing switches.

FIG. 2 is a front perspective view of another electronic device that can include one or more force sensing switches. In the illustrated embodiment, the electronic device is a smart telephone 200 that includes an enclosure 202 surrounding a display 204 and one or more buttons 206 or input devices. The enclosure 202 can be similar to the enclosure described in conjunction with FIG. 1, but may vary in form factor and function.

The display 204 can be implemented with any suitable display, including, but not limited to, a multi-touch touchscreen display that uses liquid crystal display (LCD) technology, organic light-emitting display (OLED) technology, or organic electro luminescence (OEL) technology. The multi-touch touchscreen display can include any suitable type of touch sensing technology, including, but not limited to, capacitive touch technology, ultrasound touch technology, and resistive touch technology.

The button 206 can take the form of a home button, which may be a mechanical button, a soft button (e.g., a button that does not physically move but still accepts inputs), an icon or image on a display, and so on. In some embodiments, the button 206 can include a force sensing switch. Further, in some embodiments, the button 206 can be integrated as part of a cover glass of the electronic device.

Figure 3:
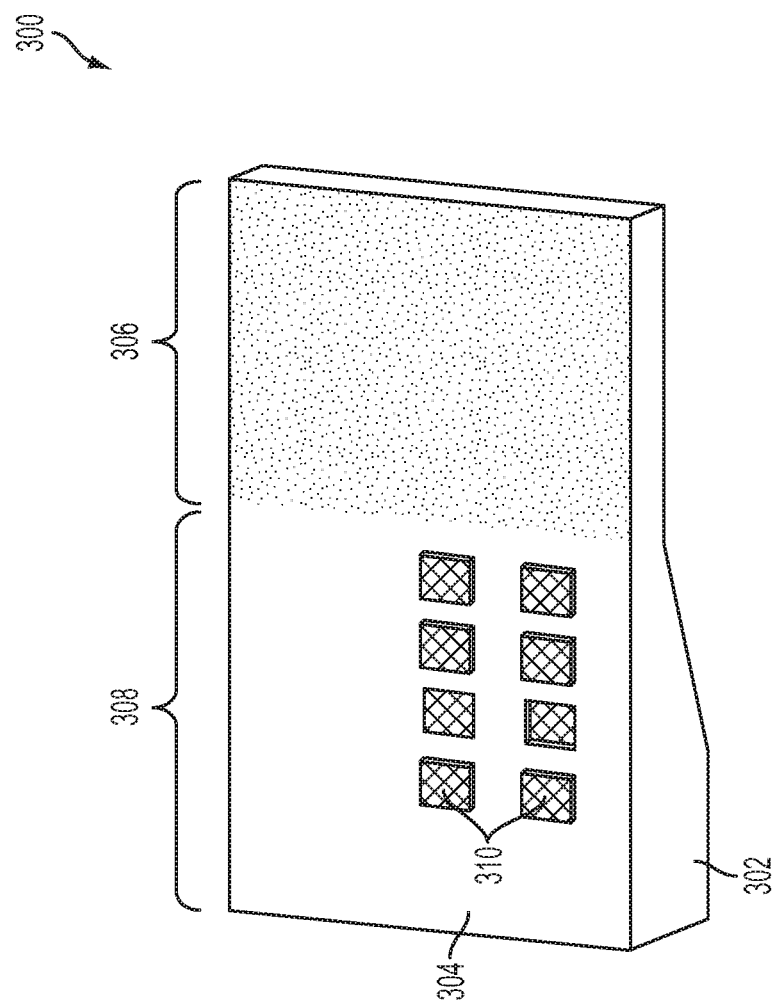
FIG. 3 is a side perspective view of another electronic device that can include one or more force sensing switches.

Referring now to FIG. 3, there is shown a perspective view of another electronic device that can include a force sensing switch. The electronic device is a remote control device 300 that includes a housing 302 and a glass upper element 304. Although the upper element 304 is described herein as a glass upper element, other embodiments can form the upper element with a different material or combination of materials. For example, the upper element 304 can be made of plastic.

The housing 302 is formed such that an interior cavity (not shown) is disposed between the bottom surface and the sidewalls of the housing 302. The interior cavity can include various structural, electrical and/or mechanical components. For example, the interior cavity can include a power source, a processing device, one or more microphones, a data storage device, one or more wireless communication devices, and one or more connector ports. The housing 302 can be made of any suitable material or materials, such as a metal, plastic, or a combination of materials.

The top surface of the glass upper element 304 can be partitioned to include different frictionally engaging surfaces, including a textured surface 306 and a second surface 308. The textured surface 306 and the second surface 308 can have substantially the same dimensions, or the two surfaces can have different dimensions. Additionally, the textured surface 306 and the second surface 308 can be positioned at locations different from the locations shown in FIG. 3.

The second surface 308 can be smooth or include some texturing or covering. The textured surface 306 can be used for user inputs, such as a touch and/or a force input. A user's finger can move or slide more easily on or over the textured surface because the finger contacts a lesser amount of surface compared to a smooth surface. Additionally or alternatively, the second surface can be used for user inputs.

Openings (not shown) can extend through the second surface 308 and/or the textured surface 306 to provide for one or more input buttons 310. The input buttons can provide for a variety of user inputs, such as volume control, channel control, a home button, a select button, navigation buttons, pause or play buttons, and a device or mode button. The input buttons can be formed with any suitable material, including metal or plastic. The input buttons can be flush with the second surface, can be recessed with respect to the surface, can protrude or extend beyond the second surface, or a combination of these configurations. Additionally or alternatively, the input buttons can have any given shape and/or surface. For example, an input button can have a textured, concave or convex surface while another input button has a smooth or flat surface. The input buttons can be shaped differently to assist a user in identifying the input buttons from one another. Raised symbols can be formed in the button surface, or the input buttons or an area around the input buttons can be illuminated to aid a user in identifying a button and its function.

Figure 4:
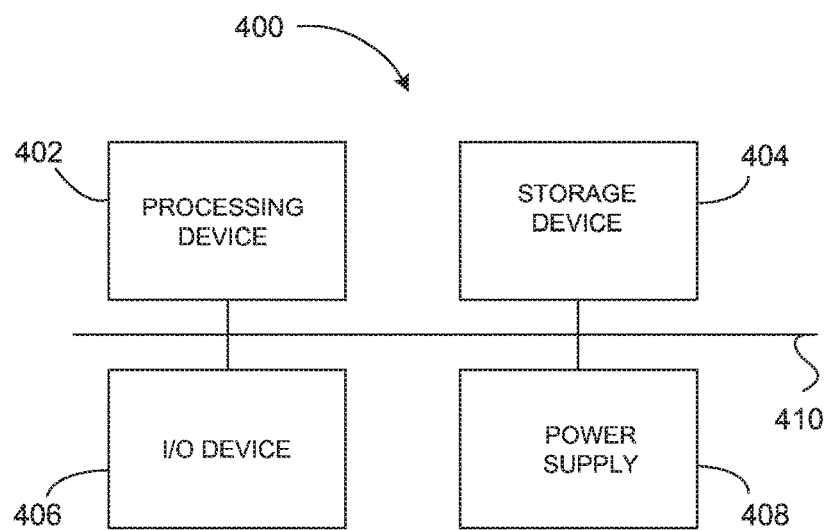
FIG. 4 is a block diagram of an electronic device that includes one or more force sensing switches.

FIG. 4 is a block diagram of an electronic device that includes one or more force sensing switches. The electronic device can be any suitable type of electronic device that has one or more switch devices. As described earlier, the electronic device can be a smart telephone, a laptop computer, a remote control device, a tablet computer, and a mouse or other user input device. By way of example only, the force sensing switch device(s) can be one or more keys in a keyboard, a button, or an input surface.

The electronic device 400 can include one or more processing devices 402, one or more data storage devices 404, input/output (I/O) devices 406, and a power source 408. The one or more processing devices 402 can control some or all of the operations of the electronic device 400. The processing device(s) 402 can communicate, either directly or indirectly, with substantially all of the components of the electronic device 400. For example, one or more system buses or signal lines 410 or other communication mechanisms can provide communication between the processing device(s) 402, the data storage device(s) 404, the I/O device (s) 406, or the power source 408. The processing device(s) 402 can be implemented as any electronic device capable of processing, receiving, or transmitting data or instructions. For example, the one or more processing devices 402 can be a microprocessor, a central processing unit (CPU), an application-specific integrated circuit (ASIC), a digital signal processor (DSP), or combinations of multiple such devices. As described herein, the term "processing device" is meant to encompass a single processor or processing unit, multiple processors, multiple processing units, or other suitably configured computing element or elements.

The data storage device(s) 404 can store electronic data that can be used by the electronic device 400. For example, a data storage device can store electrical data or content such as, for example, audio files, document files, timing signals, and image data. The data storage device(s) 404 can be configured as any type of memory. By way of example only, the memory can be implemented as random access memory, read-only memory, Flash memory, removable memory, or other types of storage elements, in any combination.

The input/output device(s) 406 can receive data from a user or one or more other electronic devices. Additionally, the input/output device(s) 406 can facilitate transmission of data to a user or to other electronic devices. For example, in embodiments where the electronic device 400 is a smart telephone, an I/O device 406 can receive data from a network or send and transmit electronic signals via a wireless or wired connection. Examples of wireless and wired connections include, but are not limited to, cellular, WiFi, Bluetooth, and Ethernet. In one or more embodiments, the I/O device supports multiple network or communication mechanisms. For example, the I/O device 406 can pair with another device over a Bluetooth network to transfer signals to the other device while simultaneously receiving signals from a WiFi or other wired or wireless connection.

In other embodiments, the I/O device(s) 406 can include a display, a mouse, a touch sensing input surface such as a trackpad, one or more buttons, one or more microphones or speakers, a keyboard, and/or a force sensing switch or switches. For example, a force sensing switch can be included in a button, the keys on a keyboard, and/or an input surface of an electronic device, such as a trackpad.

The power source 408 can be implemented with any device capable of providing energy to the electronic device 400. For example, the power source 408 can be one or more batteries or rechargeable batteries, or a connection cable that connects the electronic device 400 to another power source such as a wall outlet.

Figure 5:
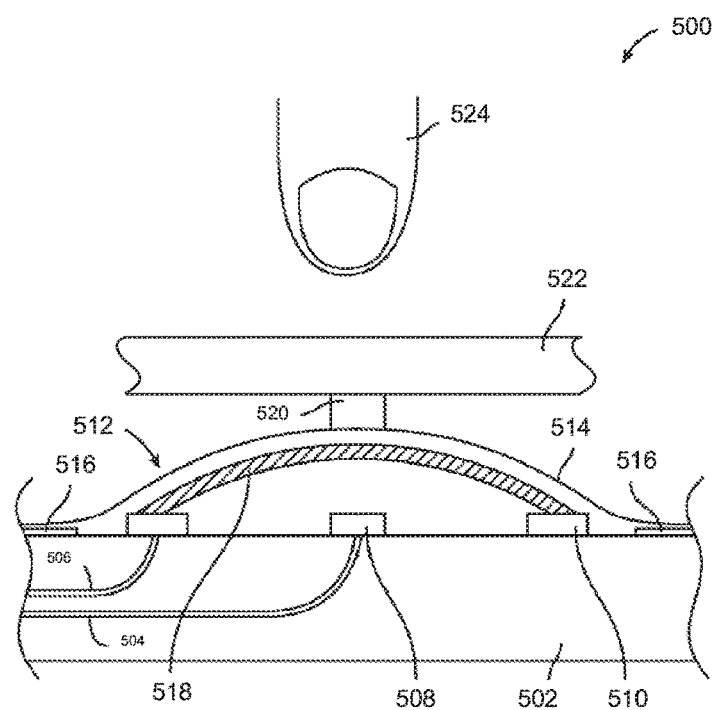
FIG. 5 is a simplified cross-section view of one example of a dome switch.

FIG. 5 illustrates a simplified view of one example of a dome switch in an unactuated or relaxed position. The dome switch 500 includes a substrate 502, conductive traces 504 and 506 disposed within the substrate 502, an inner conductive contact 508, and an outer conductive ring 510. The substrate 502 can be any suitable type of substrate, such as a flexible circuit, a printed circuit board, a frame structure, or a housing wall. In the illustrated embodiment, the substrate is a flexible circuit. The conductive trace 504 is connected to the inner conductive contact 508 while the conductive trace 506 is connected to the outer conductive ring 510.

The dome switch 500 further includes a deformable structure 512. The deformable structure 512 is shaped as a dome in the illustrated embodiment, but other embodiments can shape the deformable structure differently. The deformable structure 512 can include a flexible outer material 514 and an adhesive 516 that connects the deformable structure 512 to the substrate 502. The flexible outer material can be made of any suitable flexible material, such as polyethylene terephthalate ("PET"). The underside of the flexible outer material 514 is coated with a conductive material 518 such as graphite or gold that is connected to the outer conductive ring 510. A contact structure 520 can be disposed between the underside of the input surface 522 and the flexible outer material 514.

While in the unactuated state, the conductive material 518, the inner contact 508, and the outer contact ring 510 are not in contact with each other, causing the dome switch to be in an "open" or "off" state because a circuit formed through the conductive material 518, the inner contact 508, and the outer contact ring 510 is not complete. When a finger 524 presses down on the input surface 522, the contact structure 520 pushes down on the deformable structure 512, which in turn causes the deformable structure 512 to compress such that the conductive material 518 makes contact with both the inner conductive contact 508 and the outer conductive ring 510. This action completes the circuit formed through the conductive material 518, the inner contact 508, and the outer contact ring 510 and places the dome switch in an actuated or "on" state.

Other embodiments can construct the dome switch 500 differently. For example, a deformable structure, such as a dome, can be arranged in an inverted position such that the base of the dome connects to an outer conductive ring affixed to an underside of an input surface. An inner conductive contact is also positioned on the underside of the input surface under the dome. An inner surface of the dome can be lined with a conductive material. In the unactuated state, the switch is in an "open" or "off" state because the dome is not collapsed and the conductive material inside the dome is not in contact with both the inner conductive contact and the outer conductive ring. The dome switch is actuated when a user presses down on the input surface and the inverted dome compresses such that the inner conductive contact and the outer conductive ring both make contact with the conductive material lining the inside of the dome. This action closes the circuit and places the switch in an "on" state.

Alternatively, in other embodiments, the dome switch can include a rubber dome positioned over a metal dome. The rubber dome can include a plunger portion that extends downward from the center of the underside of the rubber dome. The plunger portion is positioned over the center of the top of the metal dome. A membrane is disposed under the metal dome, and conductive contact pads are embedded in the membrane. In an unactuated state, the conductive contact pads are not in contact with each other and the switch is in an "off" state. To place the dome switch in an "on" state, a user presses down on an input surface to compress the rubber dome such that the plunger portion contacts and pushes down on the center of the top of the metal dome, which in turn causes the metal dome to collapse and push down on the membrane. The conductive contact pads connect and close the switch when the metal dome presses down on the membrane.

Figure 6:
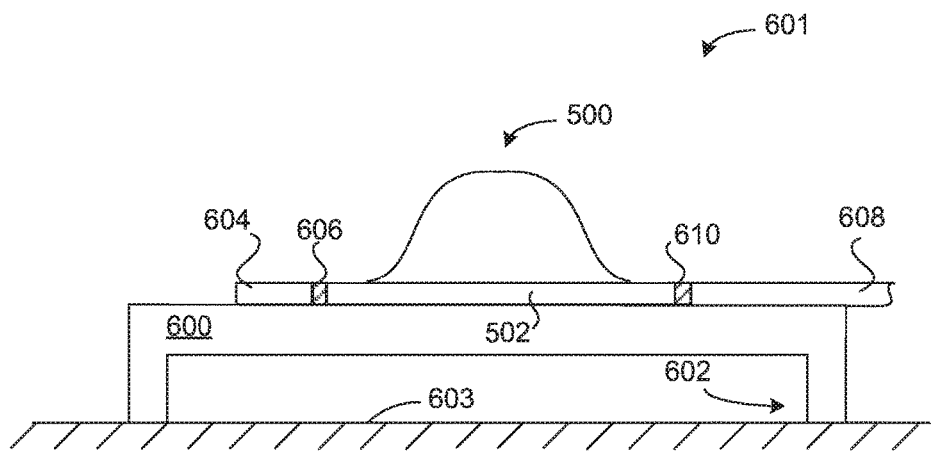
FIG. 6 is a simplified cross-section view of one example of a force sensing switch in a non-actuated state.
Figure 7:
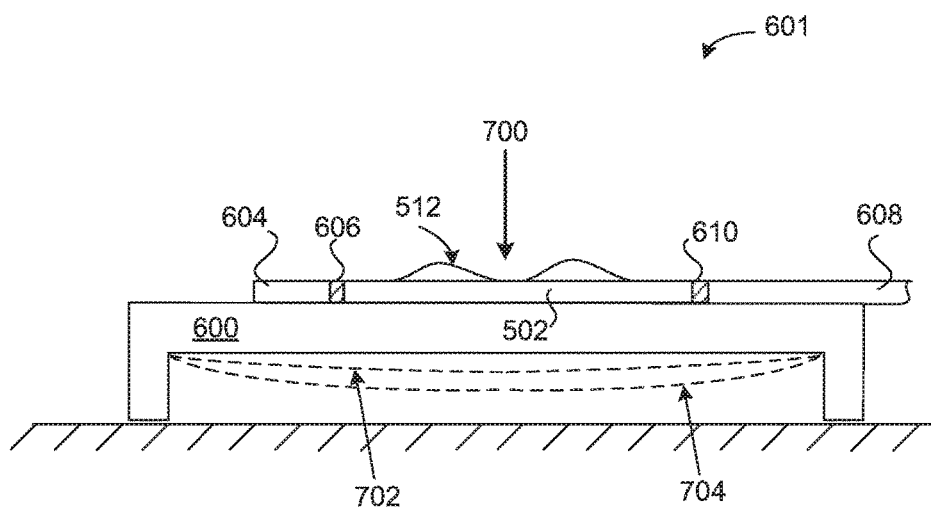
FIG. 7 is a simplified cross-section view of the force sensing switch 601 in an actuated state.

Embodiments of a force sensing switch include at least one dome switch, such as the dome switch 500. FIG. 6 depicts a simplified cross-section view of one example of a force sensing switch in an unactuated state, and FIG. 7 illustrates the force sensing switch 601 in an actuated state.

The dome switch 500 is disposed over a top surface of a deflectable beam 600 (FIG. 6). Although only one dome switch is shown in the figures, embodiments can position one or more dome switches over the top surface of the deflectable beam.

In one embodiment, the deflectable beam 600 is shaped similar to a table or stool with support structures 602 extending out and under the deflectable beam and connecting to a component or surface in the electronic device. In other embodiments, the deflectable beam can be constructed differently. By way of example only, the deflectable beam can be configured as a cantilevered beam.

The deflectable beam 600 is affixed to a structure 603. By way of example only, the structure 603 can be a surface of a frame or enclosure, or the structure can be a separate element that is affixed to the frame or enclosure. Any suitable method can be used to affix the deflectable beam 600 to the structure 603, such as, for example, an adhesive or a fastener. In some embodiments, the deflectable beam 600 can be molded with the enclosure such that the enclosure and deflectable beam are one piece.

One or more strain gauges 604 can be disposed over the top surface of the deflectable beam adjacent to, or around the dome switch 500. As described earlier, the substrate 502 is a flexible circuit or a printed circuit board in some embodiments. In the illustrated embodiment, a conductive connector 606 can operatively connect the strain gauge 604 to the flexible circuit or printed circuit board substrate 502. In other embodiments, the one or more strain gauges 604 can be placed over other surfaces of the deflectable beam 600. For example, one or more strain gauges can be disposed over the bottom surface of the deflectable beam between the two support structures 602. In such embodiments, a strain gauge or gauges can also be located over the top surface of the beam.

A flexible circuit 608 can be disposed over the top surface of the deflectable beam in one embodiment. A second conductive connector 610 can operatively connect the flexible circuit substrate 502 to the flexible circuit 608. The flexible circuit 608 can connect to a processing device or a main logic board (not shown). In other embodiments, a main logic board that includes a processing device can be positioned over the top surface of the deflectable beam 600, and the second conductive connector 610 can operatively connect the flexible circuit substrate 502 of the dome switch to the main logic board. And in yet other embodiments, the flexible circuit 608 can be omitted and the flexible circuit substrate 502 can connect to a processing device or main logic board.

When a downward force (represented by arrow 700) is applied to an input surface (not shown), the downward force is also applied to the deformable structure 512 and to the deflectable beam 600. The downward force can be sufficient to collapse the deformable structure 512 and actuate the dome switch, or the force can be insufficient to actuate the dome switch but still compress the deformable structure 512. Either way, the deformable structure 512 compresses (see FIG. 7) and the deflectable beam 600 deflects based on the applied force. Different amounts of beam deflection are represented by dashed lines 702 and 704. Dashed line 702 represents a small amount of beam deflection while dashed line 704 a greater amount of beam deflection. The one or more strain gauges 604 can be used to measure the strain produced by the beam deflection. For example, each strain gauge can output a signal representative of the amount of beam strain measured by that strain gauge.

Figure 10:
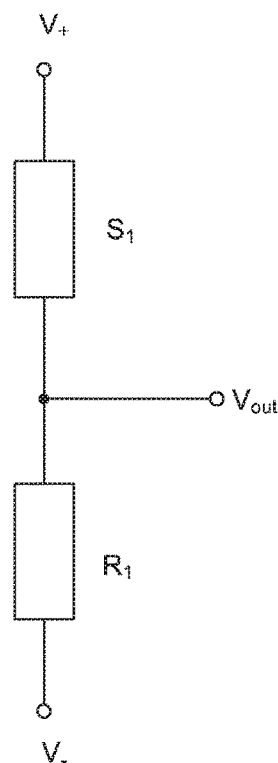

The signal or signals from the one or more strain gauges can be transmitted to a processing device on the main logic board using the conductive connector 606, the flexible circuit 502, the conductive connector 610, and the flexible circuit 608. The processing device can determine an amount of force that was applied to the input surface based on the amount of strain measured by at least one strain gauge 604. Embodiments can use any suitable type of strain gauge, including a mechanical, a resistive, a capacitive, and an optical strain gauge. By way of example only, a semiconductor strain gauge or a bonded metallic strain gauge can be used. FIGS. 8-10 illustrate different types of strain gauges that can be used in a force sensing switch in one or more embodiments.

In some embodiments, the dome switch 500 can be used to test and/or calibrate the force sensing switch 601. For example, the dome switch may collapse at a known and reproducible force. When a collapse of the dome switch is detected by the force sensing switch changing from the "off" state to the "on" state, the strain measured by at least one strain gauge can then be calibrated at this force. Since strain gauges are largely linear, strain readings at zero load and at the dome switch collapse force are sufficient to calibrate the force sensing switch 601.

In some embodiments, the force sensing switch is not operable unless the dome switch 500 is actuated. Once the dome switch is actuated, the processing device determines the amount of applied force based on a signal received from at least one strain gauge. In other embodiments, the force sensing switch operates regardless of whether the dome switch is actuated or not. Based on the applied force, the dome switch either compresses (no actuation) or is actuated, and in both cases the processing device determines the amount of applied force based on a signal received from at least one strain gauge.

The deflectable beam 600 can be formed of a material or a combination of materials that allow the beam to strain only to a maximum point (e.g., dashed line 704), thereby preventing the deflectable beam from straining too far and breaking or becoming inoperable. For example, the deflectable beam 600 can be made of steel, aluminum, glass, and/or a plastic. Additionally or alternatively, a structure (not shown) having a height that is less than the underside of the deflectable beam can be positioned below the beam 600 between the support structures 602 to prevent the deflectable beam from deflecting too far. The underside of the deflectable beam can strain only as far as the top surface of the structure under the beam. Thus, the deflectable beam 600 can have a maximum amount of deflection, which means each strain gauge has a limit on the amount of strain the gauge can measure. Once the deflectable beam reaches maximum deflection, the strain gauge or gauges will not measure any more strain, even when additional force (more force than needed to reach maximum deflection) is applied to the input surface.

FIGS. 8-10 are circuit diagrams of different types of strain gauge configurations that can be used in a force sensing switch. In FIG. 8, a strain gauge S1 and three constant resistors R are connected in a full Wheatstone bridge. A Wheatstone bridge is an electrical circuit used to measure an unknown electrical resistance by balancing two legs of a bridge circuit. One leg includes an unknown component and three legs are formed by a resistor having a known electrical resistance. In the illustrated embodiment, an output voltage $V_{OUT}$ is generated when a voltage supply $V_{EX}$ is applied to the circuit. When a force is applied to the deflectable beam and the beam deflects, a strain is generated that changes the resistance of the strain gauge S1 and changes the output voltage $V_{OUT}$.

FIG. 9 shows a circuit diagram of another type of strain gauge configuration. Four strain gauges $S_{1A}$, $S_{1B}$, $S_{2A}$, and $S_{2B}$ are electrically connected in a full Wheatstone bridge. In this configuration, the four strain gauges replace the three known resistors and the one unknown component. Instead of balancing the resistors to get a nearly zero output, a voltage output $V_{OUT}$ is generated with the resistances of the strain gauges $S_{1A}$, $S_{1B}$, $S_{2A}$, $S_{2B}$. A force applied to the deflectable beam introduces a strain that changes the resistance in each strain gauge. The output voltage $V_{OUT}$ produced when a voltage supply $V_{EX}$ is applied to the circuit changes when the resistances in the strain gauges changes.

The strain gauges can be arranged as shown in area 900. The strain gauges can be co-located such that $S_{1A}$ and $S_{1B}$ detect the strain parallel to one axis (e.g., central X-axis 1116 in FIG. 11) and $S_{2A}$ and $S_{2B}$ detect the Poisson strain generated by the strain parallel to the X-axis.

In FIG. 10, a strain gauge $S_1$ and a constant resistor $R_1$ are connected in series. This configuration is commonly called a half-bridge. The resistor $R_{OUT}$ is chosen to be nearly equal to the resistance of the strain gauge $S_1$ so that the output voltage $V_{OUT}$ generally lies midway between V+ and V−. When a force is applied to the force sensing switch, the deflectable beam deflects and a strain is generated at the strain gauge $S_1$. The strain at the strain gauge $S_1$ changes the resistance of the strain gauge $S_1$, and this in turn changes the output voltage $V_{OUT}$.

Figure 11:
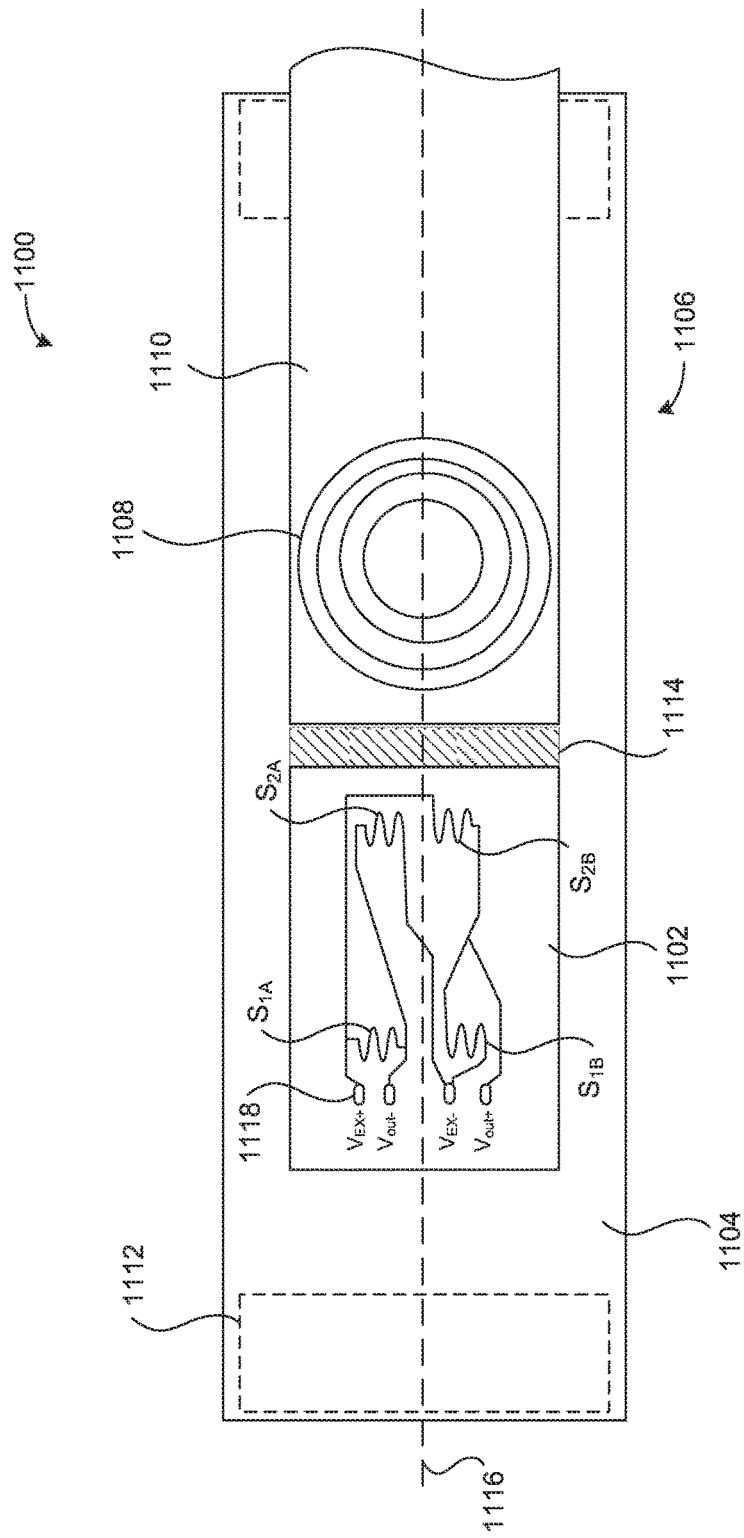
FIG. 11 is a top view of a force sensing switch.

Referring now to FIG. 11, there is shown a top view of a force sensing switch. The force sensing switch 1100 includes four strain gauges $S_{1A}$, $S_{1B}$, $S_{2A}$, $S_{2B}$ formed on a common carrier 1102. The common carrier 1102 can be affixed to the top surface 1104 of the deflectable beam 1106. In other embodiments, two of the strain gauges can be disposed over the top surface 1104 while the other two strain gauges are placed over the bottom surface of the deflectable beam.

A flexible circuit 1110 is disposed over the top surface 1104 of the deflectable beam 1106, and a deformable structure 1108 is disposed over the flexible circuit 1110. As described earlier, the deformable structure 1108 and the flexible circuit 1110 are configured as a dome switch. Support structures 1112 are shown as dashed lines in FIG. 11 since the support structures are not visible when viewing the force sensing switch from above.

A conductive connector 1114 electrically connects $V_{OUT}$, $V_{EX}$, and the four strain gauges $S_{1A}$, $S_{1B}$, $S_{2A}$, and $S_{2B}$ to the flexible circuit 1110. The common carrier 1102 is aligned with the central X-axis 1116 of the deflectable beam 1106. The common carrier 1102 is placed on the top surface 1104 such that the electrical contact pads 1118 are closer to an edge of the deflectable beam 1106 and further away from the center of the beam. It may be useful to have the electrical contact pads 1118 positioned away from the loading position to avoid damage to the pads, although it should be understood that alternative embodiments may orient the strain gauges and/or the common carrier differently.

In the illustrated embodiment, electrical contact pads 1118 are connected to nodes 902, 904, 906, 908 shown in FIG. 9, the positive input voltage $V_{EX+}$ is connected to $S_{1A}$ and $S_{2B}$, and the negative input voltage $V_{EX-}$ is connected to $S_{1B}$ and $S_{2A}$. One side of the differential output, negative output $V_{OUT-}$, is connected between $S_{1A}$ and $S_{2A}$. The other side of the differential output, positive output $V_{OUT+}$, is connected between $S_{1B}$ and $S_{2B}$.

Figure 12:
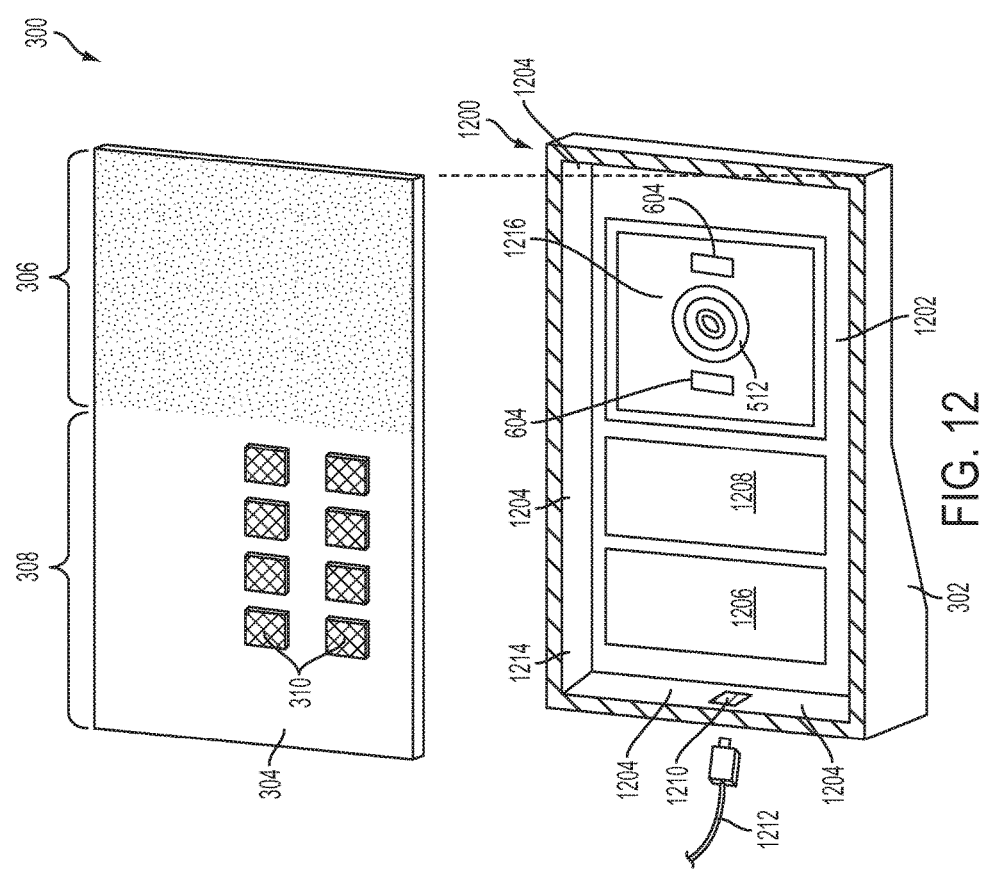
FIG. 12 is a view of the remote control device of FIG. 3 with the glass upper element 304 detached from the housing 302.

The force sensing switch will now be described in conjunction with a remote control device. However, as described earlier, the force sensing switch or switches can be included in other types of electronic devices. FIG. 12 is a view of the remote control device of FIG. 3 with the glass upper element 304 detached from the housing 302. The housing 302 is formed such that an interior cavity 1200 is disposed between the bottom 1202 and the sidewalls 1204 of the housing 302. The housing 302 can be made of any suitable material or materials, such as a metal or a plastic.

The interior cavity 1200 can include various structural, electrical and/or mechanical components. For example, the interior cavity 1200 can include a power source such as one or more batteries or rechargeable batteries 1206 and a main logic board 1208. The main logic board can include various integrated circuits in addition to one or more processing devices. For example, the main logic board can include a data storage device, one or more microphones, and other support circuits. One or more wireless communication devices such as an infrared, Bluetooth®, WiFi, or RF device can be included in the interior cavity 1200.

A connector port can receive an electrical cord or cable 1212 that connects the remote control device 300 to a power source, such as a wall outlet, to charge a rechargeable battery. Additionally or alternatively, the remote control device 300 can be connected to a charging dock to recharge the power source.

A trim 1214 can extend or protrude out along the interior edges of the sidewalls 1204. In some embodiments, only a portion of the bottom surface of the glass upper element 304 is connected to the housing. For example, the underside of glass upper element 304 below the second surface 308 can be connected to the housing or to the trim 1214. For example, an adhesive can be used to affix the glass upper element 304 to the trim 1214. In other embodiments, the underside of the glass upper element below the second surface and at least a part of the textured surface can be affixed to the housing or trim.

The underside of the glass upper element below the textured surface 306 is not connected to the trim 1214 in one embodiment. This allows the glass upper element 304 to bend when a force is applied to the textured surface 306. Since a portion of the underside of the upper element is affixed to the housing, the upper element does not pivot but rather bends at or near the interface between the affixed bottom surface and the non-affixed bottom surface. The type of glass or materials used in the glass upper element may limit the bending range such that when a user presses down on the textured surface, the user may not detect any movement in the surface. A force sensing switch 1216 can be disposed on the bottom 1202 of the housing 302 below the textured surface 306. When a force is applied to the textured surface 306, such as when a finger presses down on the surface, the textured surface bends and the force sensing switch 1216 senses the strain in the deflectable beam. A processing device on the main logic board 1208 can determine the amount of force applied to the textured surface 306 based on a signal or signals produced by one or more strain gauges on the deflectable beam. Although only one force sensing switch is shown, other embodiments can include multiple force sensing switches. For example, a force sensing switch can be positioned under the textured surface 306 and another force sensing switch can be used in combination with at least one button 310. Additionally or alternatively, two or more force sensing switches can be disposed under the textured surface 306.

Figure 13:
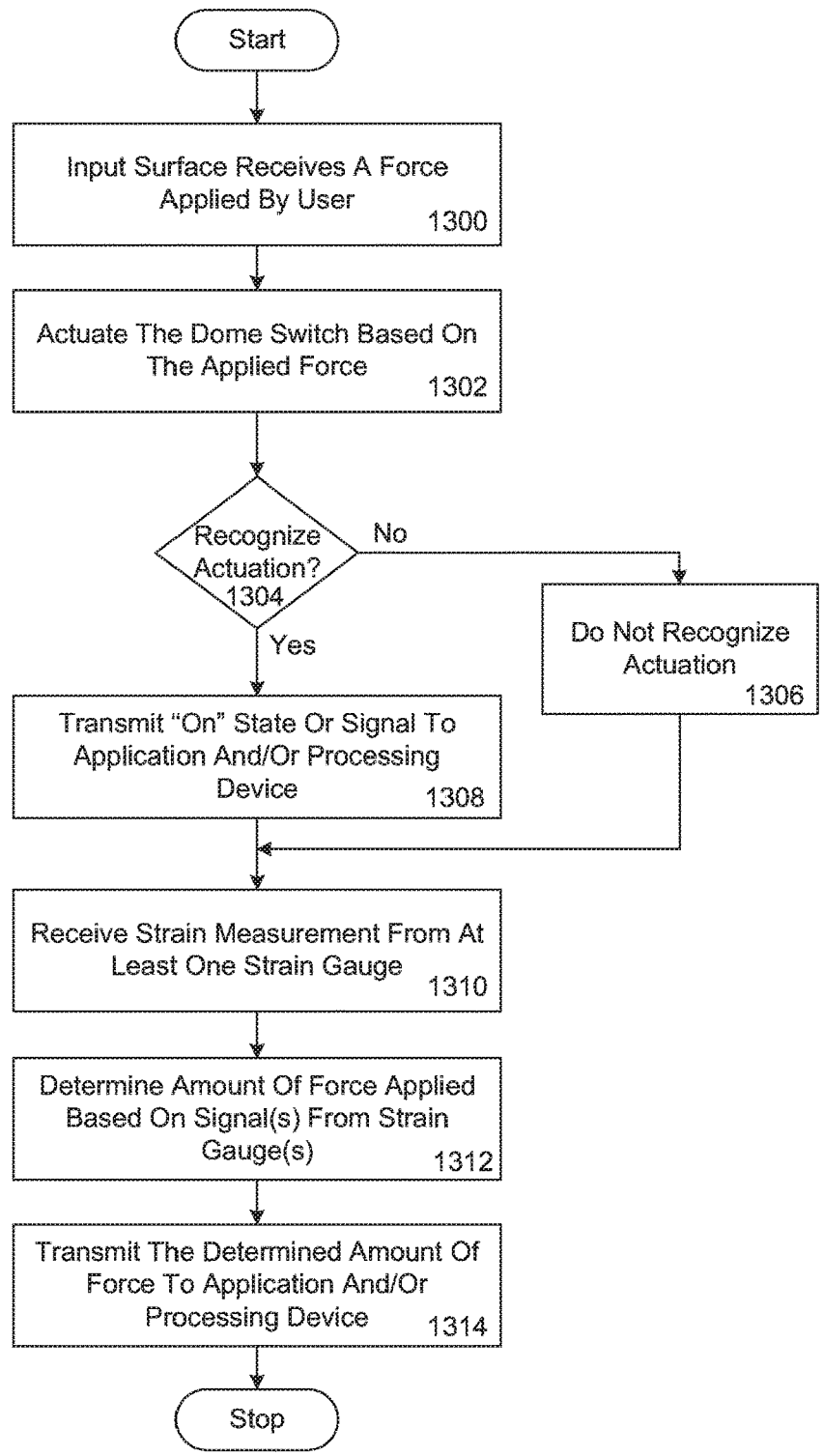
FIG. 13 is a flowchart of a method of operating a force sensing switch.

Referring now to FIG. 13, there is shown a flowchart of a method of operating a force sensing switch. Initially, at block 1300, a user applies a force to an input surface of an electronic device. By way of example only, the user can apply the force with one or more fingers, with a stylus, or through a button or key. The dome switch in the force sensing switch is then actuated based on the applied force (block 1302). Next, at block 1304 a determination is made as to whether or not the actuation of the dome switch is to be recognized. If the dome switch actuation is not to be recognized, the method passes to block 1306 where no action is taken in response to the actuation of the dome switch. For example, a processing device can receive an actuation signal from the dome switch but not take any action in response to receiving the actuation signal. Whether or not any action is taken can be determined by a software application or program that is receiving inputs from the force sensing switch.

If actuation of the dome switch is to be recognized at block 1304, the process continues at block 1308 where the "on" state or actuation signal can be transmitted to an application and/or a processing device. A strain measurement is received from one or more strain gauges and an amount of force applied to the input surface is determined at blocks 1310 and 1312. Next, as shown in block 1314, the determined amount of force is then transmitted to a processing device and/or application. Additionally or alternatively, the determined amount of force can be stored in a data storage device.

Figure 14:
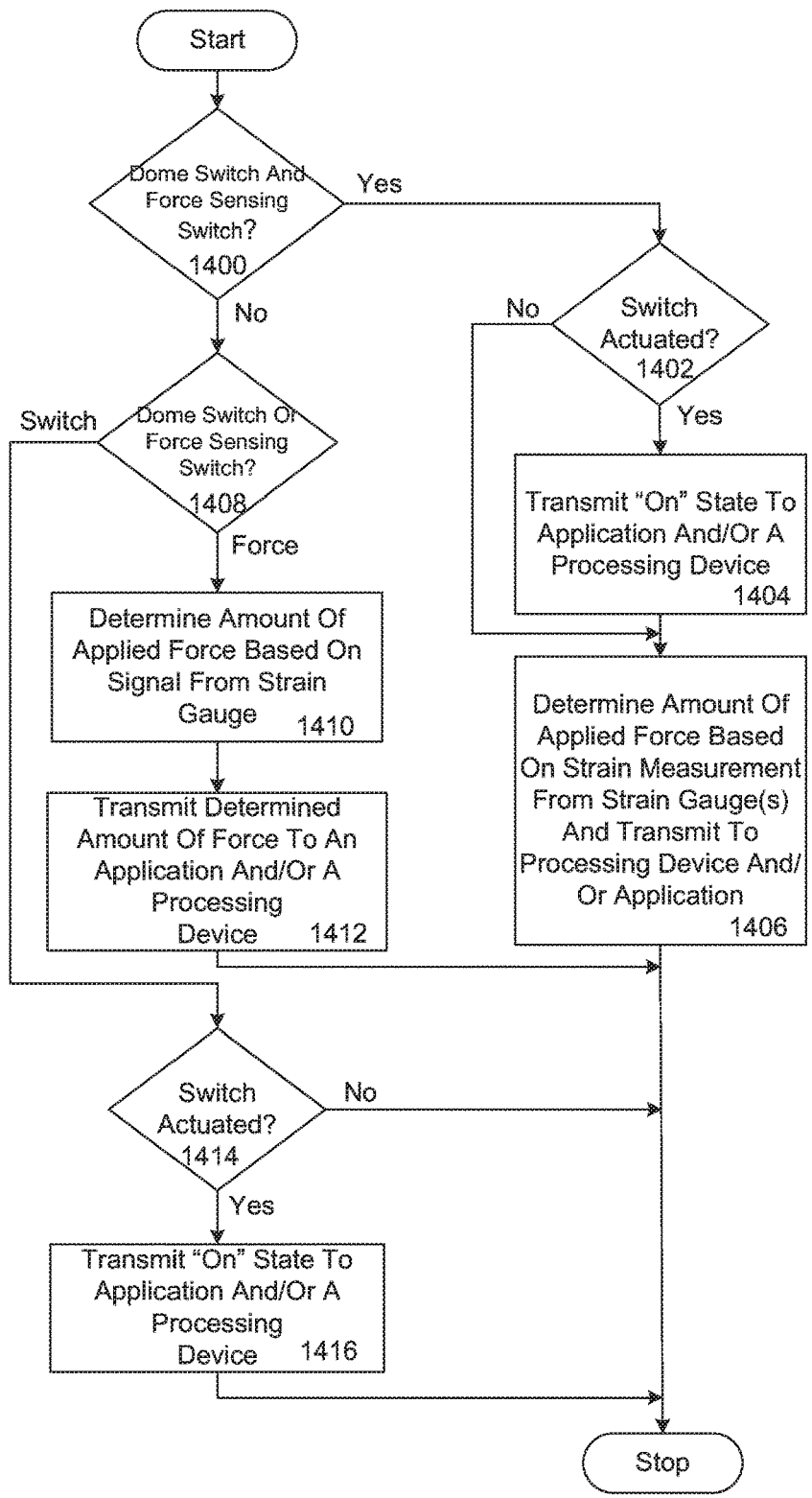
FIG. 14 is a flowchart of a method of determining an operating mode of a force sensing switch.

FIG. 14 is a flowchart of a method of determining an operating mode of a force sensing switch. In some embodiments, a force sensing switch can function as a dome switch, as a force sensing switch, or as both a dome switch and a force sensing switch. By way of example only, the operating mode can be determined by a software application or program running on, or interacting with the electronic device that includes the force sensing switch. As described earlier, a dome switch provides a binary output in that the switch is either open or closed (i.e., two states). The force sensing switch, however, can provide an analog output based on the amount of applied force. In other words, the force sensing switch is not just "open" or "closed" but can have multiple output states or signal levels based on the amount of force applied to the input surface.

Initially, a determination is made at block 1400 as to whether the force sensing switch is to operate as both a dome switch and a force sensing switch. If so, the method passes to block 1402 where a determination is made as to whether the dome switch has been actuated. If a sufficient amount of force has been applied to the input surface and the dome switch has been actuated, the "on" state or signal can be transmitted to a processing device and/or the application (block 1404). The amount of force applied to an input surface can be determined and transmitted to the processing device and/or application (block 1406). Additionally, as described in conjunction with block 1314, the determined amount of force can be stored in a data storage device.

Returning to block 1400, if the force sensing switch is not going to operate as both a dome switch and a force sensing switch, the process continues at block 1408 where a determination is made as to whether or not the switch is to operate as a dome switch or as a force sensing switch. If the switch is to function as a force sensing switch, the method passes to block 1410 where the amount of force applied to the input surface is determined. The determined amount of force can then be transmitted to the processing device and/or application (block 1412).

Returning to block 1408, if the switch is to function as a dome switch, the method continues at block 1414 where a determination is made as to whether the dome switch has been actuated. If a sufficient amount of force has been applied to the input surface and the dome switch has been actuated, the "on" state or signal can be transmitted to the processing device and/or application at block 1416.

The methods shown in FIGS. 13 and 14 can be performed differently in other embodiments. Blocks can be added or deleted, or performed in a different order. By way of example only, blocks 1400, 1402, 1404 and 1406 can be omitted in embodiments where the force sensing switch operates only as a dome switch or a force sensing switch.

Figure 15:
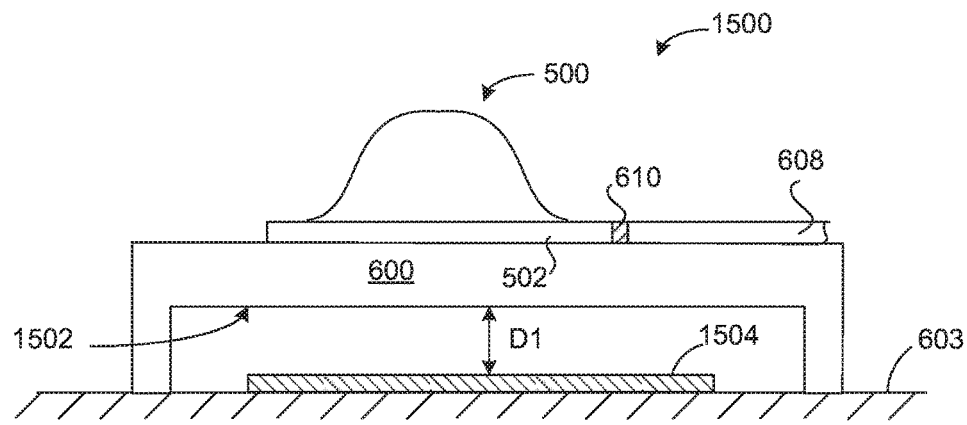
FIGS. 15-16 are simplified cross-section views of another example of a force sensing switch.
Figure 16:
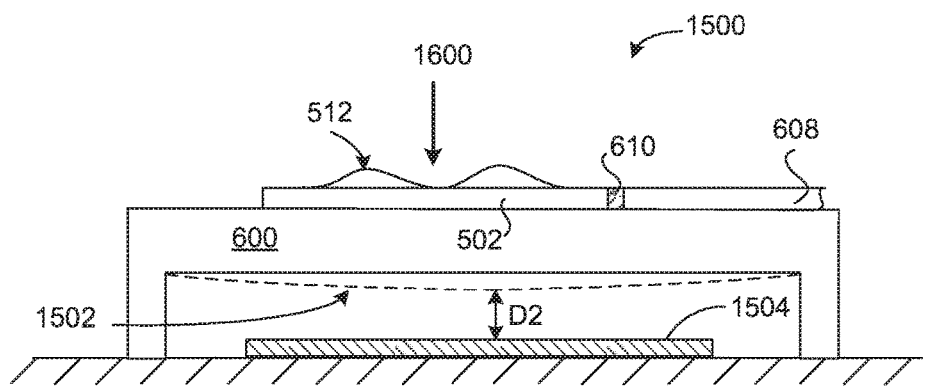

Referring now to FIGS. 15 and 16, there are shown simplified cross-section views of another example of a force sensing switch. FIG. 15 depicts the force sensing switch in an unactuated state. Some of the elements included in the force sensing switch 1500 are the same elements that are shown in FIG. 6. For simplicity, these identical elements are not described in detail.

The force sensing switch 1500 detects force by measuring capacitance changes between the bottom surface 1502 of the deflectable beam 600 and an electrode 1504 disposed under the deflectable beam and over the support structure 603. The electrode 1504 can be made of any suitable material, such as, for example, a metal. The combination of the bottom surface 1502 of the deflectable beam 600 and the electrode 1504 forms a capacitive sensing element.

The gap or distance between the bottom surface 1502 and the electrode 1504 is D1 when the force sensing switch is in an unactuated state. When a downward force (represented by arrow 1600 in FIG. 16) is applied to an input surface (not shown), the downward force is also applied to the deformable structure 512 and to the deflectable beam 600. The downward force can be sufficient to collapse the deformable structure 512 and actuate the dome switch, or the force can be insufficient to actuate the dome switch but still compress the deformable structure 512. Either way, the deformable structure 512 compresses and the deflectable beam 600 deflects based on the applied force. The beam deflection changes the distance between the bottom surface 1502 of the deflectable beam and the electrode 1504. In the illustrated embodiment, the distance decreases to D2. The change in distance results in a capacitance change between the bottom surface 1502 and the electrode 1504. The measured capacitance can be calibrated as a function of applied force and used as a force sensor.

Figure 17:
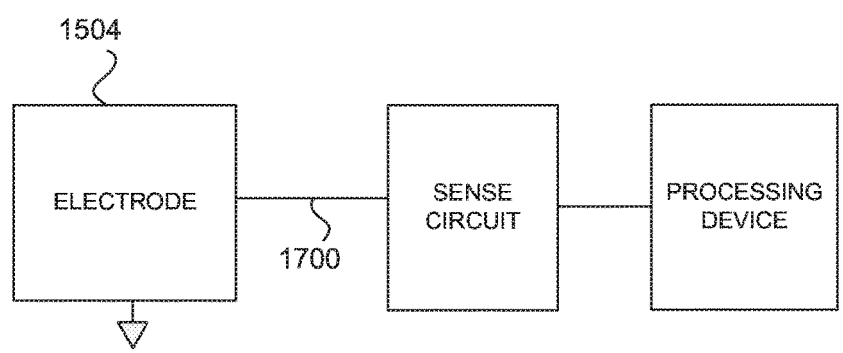
FIG. 17 is a block diagram of one example of a self-capacitance sensing system suitable for use with the force sensing switch shown in FIGS. 15-16.

The capacitive sensing element formed by the bottom surface 1502 and the electrode 1504 can operate in a self-capacitance mode or in a mutual capacitance mode. In a mutual capacitance mode, the electrode 1504 can be driven with an excitation signal and a sense line connected to the electrode 1504 scanned to measure the capacitance between the bottom surface 1502 and the electrode 1504. When the capacitive sensing element operates in a self-capacitance mode, the capacitance is measured with respect to a reference signal or voltage. FIG. 17 is a block diagram of a self-capacitance sensing system that is suitable for use with the force sensing switch shown in FIGS. 15-16. The electrode 1504 can be connected to a reference voltage, such as ground. A sense circuit scans a sense line 1700 connected to the electrode to measure the capacitance between the bottom surface 1502 and the electrode 1504. A processing device connected to the sense circuit can direct the sense circuit to scan, and can receive the measurement from the sense circuit and determine the amount of force applied to the input surface based on the measurement.

Various embodiments have been described in detail with particular reference to certain features thereof, but it will be understood that variations and modifications can be effected within the spirit and scope of the disclosure. For example, a force sensing switch has been described as being positioned below a textured surface. Other embodiments are not limited to this configuration, and a force sensing switch can be disposed under the second surface. As another example, a processing device may not be included in an electronic device having one or more force sensing switches. Instead, the electronic device can be operatively connected to a processing device and the strain measurements by a force sensing switch or switches can be transmitted to the processing device using a wired or wireless connection. Additionally, other embodiments can include additional structural, electrical and/or mechanical components in a remote control device. For example, a trackpad can be disposed under the textured surface in addition to a force sensing switch. A stiffener plate can be disposed between the glass upper element and the bottom of the housing to provide additional structural support.

Even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible.

What is claimed is:

1. A force sensing remote control for an electronic device, comprising:
    a housing defining an interior cavity;
    an upper element attached to the housing and comprising:
        a first surface;
        a second surface abutting the first surface and configured to bend in response to a force;
    at least one button surrounded by the first surface;
    a force sensing switch within the interior cavity, below the upper element, and comprising:
        a deflectable beam;
        a dome switch disposed over a top surface of the deflectable beam; and
        a strain gauge disposed on the deflectable beam; wherein
    the dome switch is configured to collapse in response to the second surface bending, thereby initiating a first signal; and
    the beam is configured to deflect in response to the second surface bending, thereby inducing strain in the strain gauge and initiating a second signal.

2. The force sensing remote control as in claim 1, wherein the deflectable beam includes support structures that extend out from the deflectable beam and connect to a support surface.

3. The force sensing remote control as in claim 1, further comprising at least one additional strain gauge disposed over a surface of the deflectable beam.

4. The force sensing remote control as in claim 3, wherein at least one additional strain gauge is disposed over the top surface of the deflectable beam.

5. The force sensing remote control switch as in claim 1, wherein the strain gauge is disposed over the top surface of the deflectable beam.

6. A remote control for an electronic device, comprising:
    a housing;
    an upper surface connected to the housing and configured to move toward the housing;

a force sensing switch beneath the upper surface, comprising:
- a deflectable beam configured to deflect in response to the upper surface moving;
- a dome switch disposed over a top surface of the deflectable beam and configured to deflect in response to the upper surface moving, thereby producing a first input signal; and
- a strain gauge disposed over a surface of the deflectable beam and operative to produce a second input signal in response to the deflectable beam deflecting; and
- a processing device operatively connected to the strain gauge and adapted to determine an amount of applied force based on a strain measurement received from the strain gauge.

7. The remote control for an electronic device as in claim 6, wherein the strain gauge is disposed over the top surface of the deflectable beam.

8. The remote control for an electronic device as in claim 6, further comprising at least one additional strain gauge disposed over a surface of the deflectable beam, wherein the at least one additional strain gauge is operatively connected to the processing device.

9. The remote control for an electronic device as in claim 6, wherein the electronic device comprises one of a remote control device, a mouse, a smart telephone, or a computer.

10. A method for operating a force sensing switch that includes a strain gauge and a dome switch disposed over a surface of a deflectable beam, wherein the force sensing switch is disposed below an input surface in an electronic device, the method comprising:
- initiating a signal indicating the dome switch has deformed in response to a force applied to the input surface, the force causing the input surface to translate and deform the dome switch;
- receiving a strain measurement from the strain gauge that represents an amount of strain of the deflectable beam, the strain measurement based on the force applied to the input surface; and
- determining an amount of force applied to the input surface based on the strain measurement; wherein
- the signal and the strain measurement are separate from one another.

11. The method as in claim 10, wherein the deformation of the dome switch actuates the dome switch.

12. The method as in claim 10, further comprising not recognizing the actuation of the dome switch such that an action is not taken based on the actuation of the dome switch.

13. A method for determining an operating mode of a remote control having a force sensing switch that includes a strain gauge disposed over a surface of a deflectable beam and a dome switch disposed over a top surface of the deflectable beam, wherein the force sensing switch is disposed below an input surface of the remote control, the method comprising:
- in response to receiving an input force on the input surface of the remote control, moving the input surface toward the force sensing switch positioned in an interior volume of the remote control, the force sensing switch comprising the dome switch and the strain gauge positioned on the beam;
- in response to the input surface moving toward the force sensing switch, initiating collapse of a dome;
- if the dome fully collapses, actuating the dome switch;
- in response to the input surface moving toward the force sensing switch, deflecting the beam, thereby inducing strain in the strain gauge;
- determining whether the force sensing switch is to operate as a binary switch or as a non-binary force sensing switch;
- if the force sensing switch is to operate as a binary switch, determining whether the dome switch is actuated; and
- if the force sensing switch is to operate as the non-binary force sensing switch, determining an amount of force applied to the input surface based on a strain measurement received from the strain gauge.

14. The method as in claim 13, further comprising transmitting an on signal to a processing device when the dome switch is actuated.

15. The method as in claim 13, further comprising transmitting the determined amount of force to a processing device when the force sensing switch operates as the non-binary force sensing switch.

16. An electronic device, comprising:
- a housing;
- an upper surface connected to the housing and configured to move toward the housing;
- a deflectable beam within the housing;
- a dome switch within the housing and disposed over a top surface of the deflectable beam, the dome switch configured to be contacted by the upper surface; and
- an electrode disposed under a bottom surface of the deflectable beam, wherein the bottom surface of the deflectable beam and the electrode form a capacitive sensing element.

17. The electronic device as in claim 16, further comprising a sense line connected between a sense circuit and the electrode.

18. The electronic device as in claim 17, further comprising a processing device connected to the sense circuit.

19. A method for operating a force sensing switch that includes a dome switch disposed over a top surface of a deflectable beam and an electrode disposed under a bottom surface of the deflectable beam, wherein the force sensing switch is disposed below an input surface in an electronic device, the method comprising:
- initiating a signal when the dome switch collapses in response to a force applied to the input surface;
- measuring a capacitance between the bottom surface of the deflectable beam and the electrode in response to the force applied to the input surface; and
- determining an amount of force applied to the input surface based on the measured capacitance; wherein
- the signal and the measured capacitance are separate electrical outputs.

* * * * *